US007109755B2

(12) United States Patent
Garmatyuk et al.

(10) Patent No.: US 7,109,755 B2
(45) Date of Patent: Sep. 19, 2006

(54) POWER DELIVERY NOISE CANCELLATION MECHANISM

(75) Inventors: Dmitriy S. Garmatyuk, Folsom, CA (US); Christopher D. Loental, Sacramento, CA (US); Andrew Martwick, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 10/974,220

(22) Filed: Oct. 27, 2004

(65) Prior Publication Data

US 2006/0087338 A1    Apr. 27, 2006

(51) Int. Cl.
*H03K 19/0175* (2006.01)
(52) U.S. Cl. .......................... 326/83; 326/27
(58) Field of Classification Search ................ 326/26, 326/27, 83–87
See application file for complete search history.

(56) References Cited

U.S. PATENT DOCUMENTS

| 4,672,243 | A  | * | 6/1987 | Kirsch | ......................... 326/71 |
| 5,786,711 | A  | * | 7/1998 | Choi | ........................... 326/83 |
| 6,366,124 | B1 | * | 4/2002 | Kwong | ....................... 326/81 |
| 2004/0080340 | A1 | * | 4/2004 | Hidaka | ....................... 326/83 |

* cited by examiner

*Primary Examiner*—Don Le
(74) *Attorney, Agent, or Firm*—Blakely, Sokoloff, Taylor & Zafman LLP

(57) ABSTRACT

An integrated circuit is disclosed. The integrated circuit includes a power delivery network (PDN), a first voltage rail coupled to the PDN, an input/output (I/O) buffer coupled to the first voltage rail and a driver coupled to the I/O buffer. The driver transmits a current waveform to the I/O buffer whenever a switching event occurs at the I/O buffer.

16 Claims, 3 Drawing Sheets

POWER DELIVERY NOISE CANCELLATION MECHANISM

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to computer systems; more particularly, the present invention relates to delivering power to an input/output (I/O) buffer.

BACKGROUND

I/O buffers are implemented in integrated circuit devices to transmit and receive data. Typically, whenever an I/O buffer switches from a high to a low state (e.g., when receiving or transmitting data), a current propagates from an on-board voltage supply, through a voltage rail (Vcc rail) to the buffer.

However, there is a parasitic inductance associated with trace routes from the on-board voltage supply to the I/O power rails on the integrated circuit. This inductance, if left unbalanced by a certain value of decoupling capacitance, results in a sharp drop in voltage on the Vcc rail at the event of current pull from the supply (di/dt, where i is current, and t is time, describes the rate of this pull), initiated by the buffer during data switching.

A large decoupling capacitance is traditionally added to the power delivery network to balance the parasitic inductance and prevent voltage droops. Such a capacitance is on-die and serves as storage for additional charge. Whenever the I/O buffer switches, the capacitance provides stored charge on the Vcc rail to compensate for any voltage droop.

BRIEF DESCRIPTION OF THE DRAWINGS

The invention is illustrated by way of example and not limitation in the figures of the accompanying drawings, in which like references indicate similar elements, and in which.

DETAILED DESCRIPTION

According to one embodiment, a power delivery system noise cancellation mechanism is described. In the following detailed description of the present invention, numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
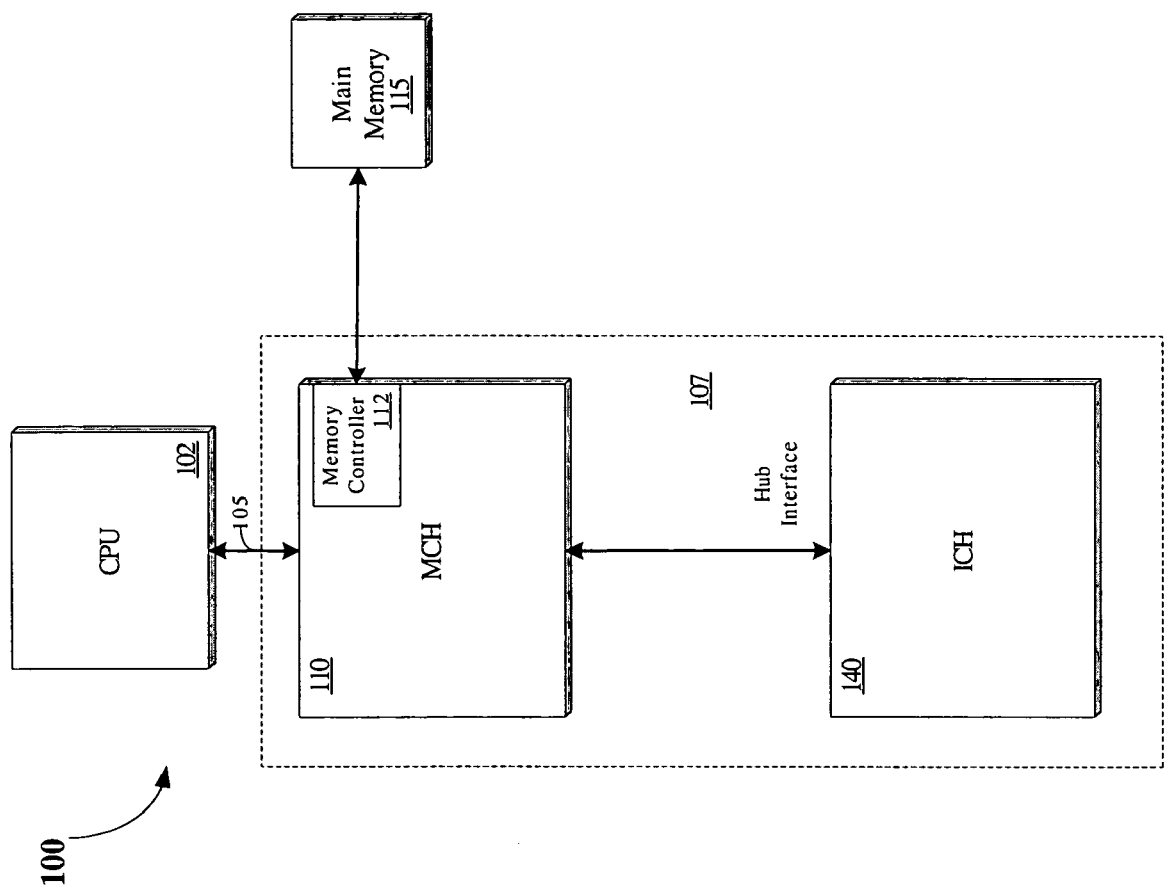
FIG. 1 is a block diagram of one embodiment of a computer system.

FIG. 1 is a block diagram of one embodiment of a computer system 100. Computer system 100 includes a central processing unit (CPU) 102 coupled to bus 105. In one embodiment, CPU 102 is a processor in the Pentium® family of processors including the Pentium® II processor family, Pentium® III processors, and Pentium® IV processors available from Intel Corporation of Santa Clara, Calif. Alternatively, other CPUs may be used.

A chipset 107 is also coupled to bus 105. Chipset 107 includes a memory control hub (MCH) 110. MCH 110 may include a memory controller 112 that is coupled to a main system memory 115. Main system memory 115 stores data and sequences of instructions that are executed by CPU 102 or any other device included in system 100. In one embodiment, main system memory 115 includes dynamic random access memory (DRAM); however, main system memory 115 may be implemented using other memory types. Additional devices may also be coupled to bus 105, such as multiple CPUs and/or multiple system memories.

Chipset 107 also includes an input/output control hub (ICH) 140 coupled to MCH 110 to via a hub interface. ICH 140 provides an interface to input/output (I/O) devices within computer system 100. For instance, ICH 140 may be coupled to a Peripheral Component Interconnect bus adhering to a Specification Revision 2.1 bus developed by the PCI Special Interest Group of Portland, Oreg.

CPU 102, the components of chipset 107 and memory 115 all include I/O buffers to facilitate the transmitting and receiving data. As discussed above, noise attributed to parasitic inductance is typically present on a voltage supply rail coupled between the power delivery network and the I/O buffer. One mechanism to reduce power delivery noise is to increase the value of conventional static on-die decoupling capacitance. This is a commonly used method of solving a power delivery noise problem. However, the method includes large quantities of on-die capacitance. Such large capacitance consumes a relatively large amount of space, thus increasing the cost of the die.

Another method is to use a "charge pump" approach, in which two capacitors are alternately connected in parallel and in series to store energy and pump the charge into the power rail during data events. However, this method has been found to be inefficient for receiver configurations.

Yet another mechanism is to use a feedback-based slew-control buffer design to detect data switching events and adjust buffer characteristics during them so as to minimize di/dt ratio and, therefore, reduce power delivery noise. This method, while addressing the problem of reducing di/dt, tends to complicate buffer design, increase buffer size and worsen propagation delay of the transmitted signals. Furthermore, the efficiency in receiver configuration is much degraded compared to transmitter configuration.

According to one embodiment, a current waveform from an external supply is transmitted to an I/O buffer whenever a switching event occurs, thus reducing the amount of current that needs to be pulled from the main supply through the parasitic inductance. As a result, voltage droops proportional to the current flowing through the inductance is diminished.

Figure 2:
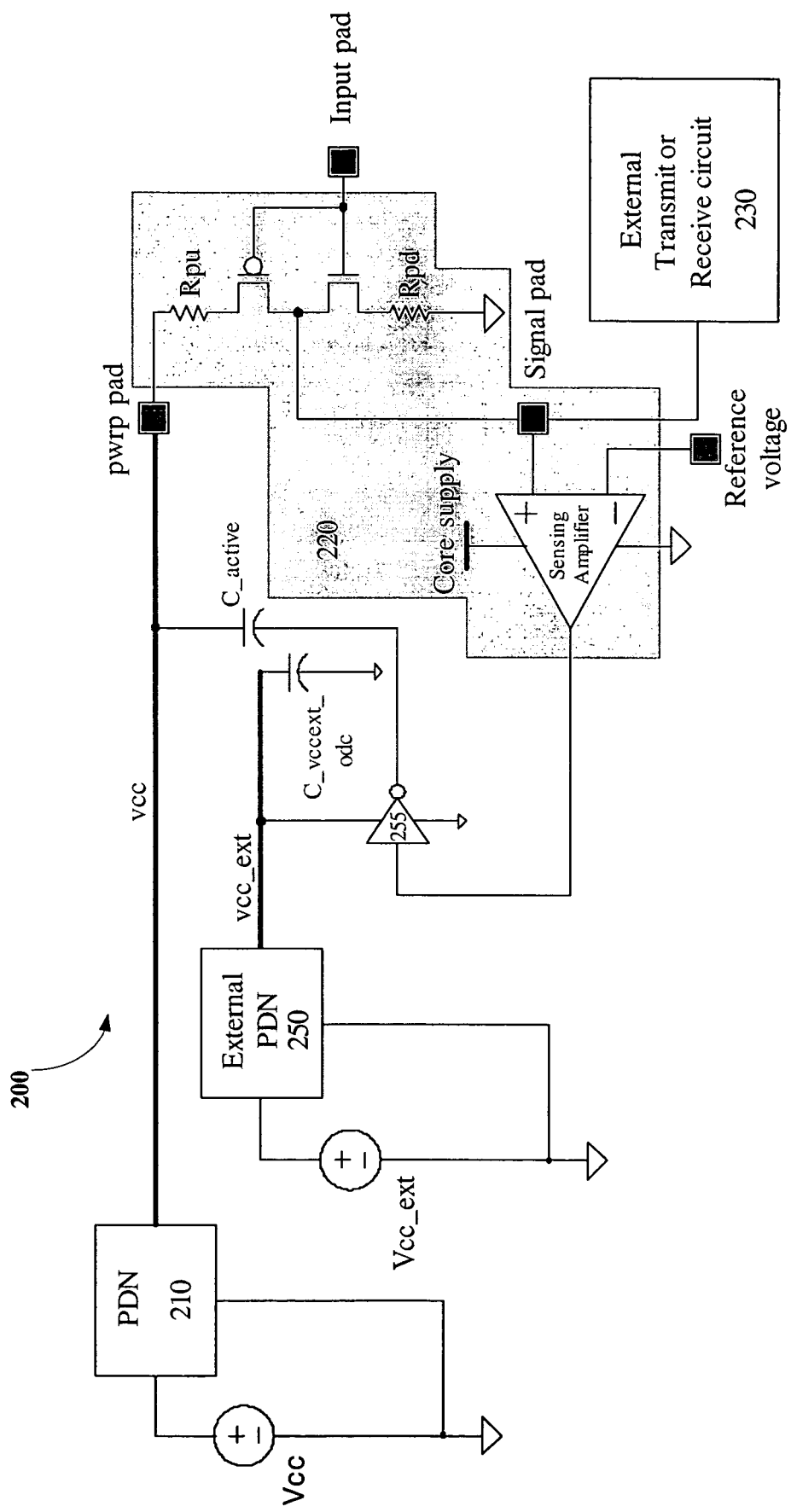
FIG. 2 illustrates one embodiment of an I/O buffer coupled to a power delivery network.

FIG. 2 illustrates one embodiment of a system 200. System 200 includes power delivery network (PDN) 210, I/O buffer 220, a signal pad and external transmit or receive circuit 230. PDN 230 delivers power from a voltage source Vcc to I/O buffer 220 via a Vcc rail. Buffer 220 includes driver transistors to drive data out of buffer 220. In addition, a sensing amplifier is included to sense a transition on signal pad of buffer 220.

The input pad is coupled to the driver transistors. If I/O buffer 220 is in the transmit mode, data is driven from system 200 into external transmit or receive circuit 230 which is then presumed to be in receive mode, as facilitated by its internal switch. Whenever the external transmit or receive circuit 230 is in transmit mode, the internal switch facilitates data transmission from transmit or receive circuit 230 to buffer 200 in which case input pad is driven low to configure driver transistors as receive circuit.

As previously mentioned, components are included within system 200 to provide an external power supply to I/O buffer 220. These components include an external PDN 250, an external power rail that is not coupled to the main I/O buffer power rail, an active capacitance (C_active), and an active capacitance driver 255 with input connected to the output of the sensing amplifier. In addition, an on-die decoupling capacitance (C_odc) is included.

When data (either driver data in transmit configuration of I/O buffer 220, or data coming to the I/O buffer from external transmit or receive circuit 230 when I/O buffer 220 is in receive configuration) switches from high to low, current is pulled from the Vcc supply at the rate of data transition, causing the Vcc node to start drooping. At the same time, the sensing amplifier will sense the transition and start driving active capacitance driver 255 with a low signal.

Subsequently, capacitance driver 255 will start transitioning from low to high, raising the voltage at the base of the C_active capacitance and C_active to build up a current, proportional to dU/dt, where U is the voltage across C_active. Current flow from the main Vcc supply is reduced by the amount of current supplied by C_active, reversing negative effects of di/dt on parasitic inductance, reducing voltage droop on Vcc rail.

Figure 3:
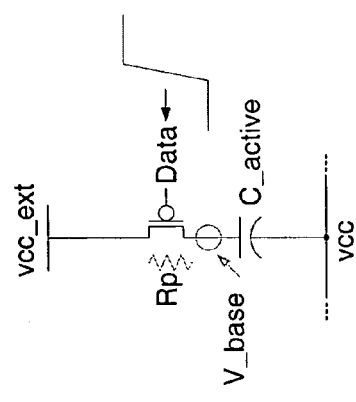
FIG. 3 illustrates one embodiment of an I/O buffer.
Figure 4:
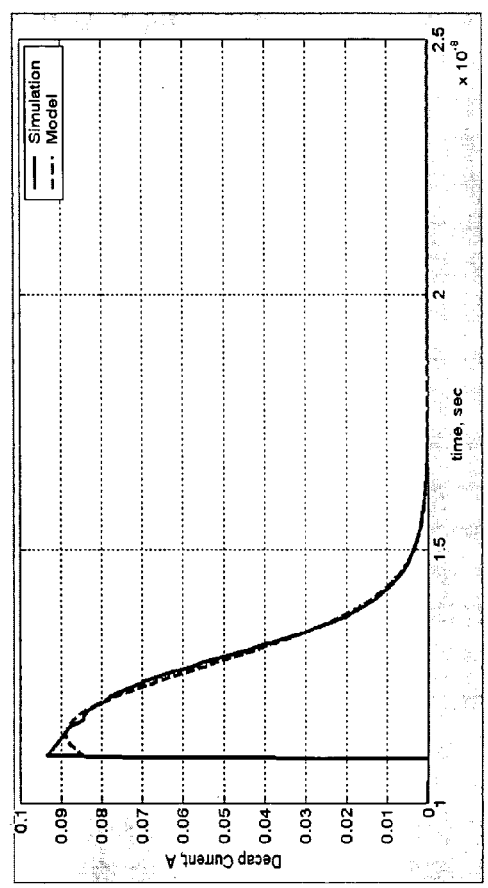
FIG. 4 illustrates one embodiment of a current waveform.

FIG. 3 illustrates one embodiment of a model illustrating the above-described process. A formula describing the parameters of this model is:

$$I_{decap} = C_{active} \frac{\partial (vcc - V_{base})}{\partial t} \approx -C_{active} \frac{\partial V_{base}}{\partial t}$$

$$V_{base} = vcc\_ext \cdot (1 - e^{-t/[Rp(t)(C_{active}+C_p)]}), \text{ and}$$

$$Rp(t) \sim \frac{vcc\_ext - V_{base}}{k(V_{gs} - V_t)^2}$$

where Rp, Cp, $V_{gs}$ and $V_t$ refer to transistor parameters of a PMOS transistor in the inverter. An example of $I_{decap}$ waveform, assuming certain values of the model parameters, is shown in FIG. 4.

The above-described mechanism achieves a good level of power delivery noise reduction in both receiver (RX) and transmitter (TX) configurations of the I/O buffer 220 without increase in decoupling capacitance area size and buffer complexity.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

What is claimed is:

1. An integrated circuit comprising:
    a power delivery network (PDN);
    a first voltage rail coupled to the PDN;
    an input/output (I/O) buffer coupled to the first voltage rail; and
    a driver coupled to the I/O buffer to transmit a current waveform to the first voltage rail whenever a switching event occurs at the I/O buffer.

2. The integrated circuit of claim 1 wherein the current waveform is received from an external power supply.

3. The integrated circuit of claim 1 further comprising an active capacitance coupled between the power rail and the driver.

4. The integrated circuit of claim 3 further comprising:
    an external voltage rail coupled to the driver; and
    an external PDN coupled to the external voltage rail.

5. The integrated circuit of claim 4 wherein the external voltage rail is separate from the first voltage rail.

6. The integrated circuit of claim 1 wherein the I/O buffer comprises:
    driver transistors coupled to the power rail; and
    a sense amplifier coupled to the driver transistors and the driver.

7. The integrated circuit of claim 6 further comprising:
    an input pad coupled to the driver transistors; and
    an external transmit or receive circuit coupled to the driver transistors and the sense amplifier.

8. A method comprising:
    detecting a switching event at an input/output (I/O) buffer
    receiving a first current at the I/O buffer from a first voltage source via a voltage rail; and
    receiving a second current at the I/O buffer from a second voltage source via a driver coupled to the voltage rail.

9. The method of claim 8 wherein the current from the second voltage source reduces the current that is to be received from the first voltage source.

10. The method of claim 8 wherein detecting a switching event at the I/O buffer comprises a sense amplifier detecting a low to high transition at the I/O buffer.

11. The method of claim 10 further comprising:
    the driver causing an active capacitance to accumulate current; and
    providing the current from the active capacitance to the I/O buffer via the first voltage rail.

12. A computer system comprising:
    a main memory device;
    a chipset coupled to the main memory device; and
    a processor including:
    a power delivery network (PDN);
    a first voltage rail coupled to the PDN;
    an input/output (I/O) buffer coupled to the first voltage rail; and
    a driver coupled to the I/O buffer to transmit a current waveform to the I/O buffer whenever a switching event occurs at the I/O buffer.

13. The computer system of claim 12 wherein the processor further comprises an active capacitance coupled between the power rail and the driver.

14. The computer system of claim 13 wherein the processor further comprises:
    an external voltage rail coupled to the driver; and
    an external PDN coupled to the external voltage rail.

15. The computer system of claim 12 wherein the I/O buffer comprises:

driver transistors coupled to the power rail; and
a sense amplifier coupled to the driver transistors and the driver.

16. The computer system of claim 12 wherein the chipset comprises:
a second PDN;
a second voltage rail coupled to the second PDN;
a second I/O buffer coupled to the second voltage rail; and
a driver coupled to the second I/O buffer to transmit a current waveform to the second I/O buffer whenever a switching event occurs at the second I/O buffer.

* * * * *